United States Patent
Chi et al.

(10) Patent No.: US 8,455,300 B2
(45) Date of Patent: Jun. 4, 2013

(54) INTEGRATED CIRCUIT PACKAGE SYSTEM WITH EMBEDDED DIE SUPERSTRUCTURE AND METHOD OF MANUFACTURE THEREOF

(75) Inventors: HeeJo Chi, Ichon-si (KR); NamJu Cho, Uiwang-si (KR); ChanHoon Ko, Ichon si (KR)

(73) Assignee: STATS ChipPAC Ltd., Singapore (SG)

( * ) Notice: Subject to any disclaimer, the term of this patent is extended or adjusted under 35 U.S.C. 154(b) by 354 days.

(21) Appl. No.: 12/787,216

(22) Filed: May 25, 2010

(65) Prior Publication Data
US 2011/0291283 A1 Dec. 1, 2011

(51) Int. Cl.
H01L 21/00 (2006.01)
H01L 23/06 (2006.01)
H01L 23/02 (2006.01)

(52) U.S. Cl.
USPC .................... 438/109; 257/668; 257/686

(58) Field of Classification Search
USPC .................... 438/109; 257/668, 686
See application file for complete search history.

(56) References Cited

U.S. PATENT DOCUMENTS

| | | | |
|---|---|---|---|
| 6,709,897 B2 | 3/2004 | Cheng et al. | |
| 6,746,898 B2 | 6/2004 | Lin et al. | |
| 6,960,826 B2 | 11/2005 | Ho et al. | |
| 7,084,513 B2 | 8/2006 | Matsuki et al. | |
| 7,312,405 B2 | 12/2007 | Hsu | |
| 2002/0070443 A1 | 6/2002 | Mu et al. | |
| 2008/0029870 A1 | 2/2008 | Chen et al. | |
| 2008/0272477 A1* | 11/2008 | Do et al. | 257/686 |
| 2010/0078655 A1 | 4/2010 | Yang | |
| 2011/0193235 A1* | 8/2011 | Hu et al. | 257/773 |
| 2011/0204505 A1* | 8/2011 | Pagaila et al. | 257/686 |

OTHER PUBLICATIONS

U.S. Appl. No. 12/329,789, filed Dec. 8, 2008, Lin et al.

* cited by examiner

*Primary Examiner* — James Mitchell
(74) *Attorney, Agent, or Firm* — Ishimaru & Associates LLP; John Yang

(57) ABSTRACT

A method of manufacture of an integrated circuit package system includes: providing a through-silicon-via die having conductive vias therethrough; forming a first redistribution layer on a bottom of the through-silicon-via die coupled to the conductive vias; forming a second redistribution layer on the top of the through-silicon-via die coupled to the conductive vias; fabricating an embedded die superstructure on the second redistribution layer including: mounting an integrated circuit die to the second redistribution layer, forming a core material layer on the second redistribution layer to be coplanar with the integrated circuit die, forming a first build-up layer, having contact links coupled to the integrated circuit die, on the core material layer, and coupling component interconnect pads to the contact links; and forming system interconnects on the first redistribution layer for coupling the through-silicon-via die, the integrated circuit die, the component interconnect pads, or a combination thereof.

14 Claims, 4 Drawing Sheets

INTEGRATED CIRCUIT PACKAGE SYSTEM WITH EMBEDDED DIE SUPERSTRUCTURE AND METHOD OF MANUFACTURE THEREOF

TECHNICAL FIELD

The present invention relates generally to an integrated circuit package system, and more particularly to a system for manufacturing a multi-chip package with embedded die superstructure.

BACKGROUND ART

In the field of semiconductor devices, the device density is increasing while the device dimensions are continuously reduced. The demand on packaging and interconnecting techniques in such high density devices is also complicated by mechanical fragility and manufacturing yield issues. Conventionally, in the flip-chip attachment method, an array of solder bumps is formed on the surface of the die. The formation of the solder bumps may be carried out by using a solder composite material through a solder mask for producing a desired pattern of solder bumps. The function of chip package includes power distribution, signal distribution, heat dissipation, protection and support, and so on. As a semiconductor become more complicated, the traditional package techniques, such as lead frame package, flex package, rigid package technique, can't support the demand of producing smaller chip packages with high density elements in the package.

Conventional package technologies have to divide a wafer into respective dies, mount the die on a support structure, and wire the die to the support structure by a wire bonding process. These techniques are time consuming and subject to defects created during the manufacturing process. Since chip packaging techniques are highly influenced by the development of integrated circuits, there is a constant demand to enhance the packaging processes to provide more efficient and robust integrated circuit packages.

The trend of package technologies is toward ball grid array (BGA), flip chip (FC-BGA), chip scale package (CSP), Wafer level package (WLP) to meet the efficiency and reliability requirements. "Wafer level package" is to be understood to mean that the entire package and all the interconnections on the wafer as well as other processing steps are carried out before the singulation (dicing) of the semiconductor wafer into packaged chips. Generally, after completion of all packaging processes, individual semiconductor packages are separated from a wafer having a plurality of semiconductor dice. The wafer level package has extremely small dimensions combined with extremely good electrical properties, making it a popular technology for advanced packaging.

Because the wafer level package technique utilizes the whole wafer as one object, before performing a scribing/dicing process, all of the packaging and testing would have already been accomplished. Furthermore, with the wafer level package technique the processes of wire bonding, die mount, molding and/or under-fill may be omitted. The omission of these more mechanical process steps can reduce the amount of defects introduced by positioning errors or mechanical reliability. By utilizing wafer level package technique, the cost and manufacturing time can be reduced, and the package reliability can be enhanced.

Though the advantages of wafer level package technique mentioned above are significant, some issues still exist that hinder the acceptance of wafer level package technique. For instance, the coefficient of thermal expansion (CTE) mismatch between the materials of a wafer level package and the mother board (PCB) becomes another critical factor to mechanical instability of the structure. The total number of interconnects may be limited by the chip size area with no way to provide multi-chip and system in package solutions.

Thus, a need still remains for an integrated circuit package system with embedded die superstructure, in order to enhance the manufacturing processes and deliver flexible system solutions. In view of the constant demand for increased performance, reliability, and reduced size of the products, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit package system including: providing a through-silicon-via die having conductive vias therethrough; forming a first redistribution layer on a bottom of the through-silicon-via die coupled to the conductive vias; forming a second redistribution layer on the top of the through-silicon-via die coupled to the conductive vias; fabricating an embedded die superstructure on the second redistribution layer including: mounting an integrated circuit die to the second redistribution layer, forming a core material layer on the second redistribution layer to be coplanar with the integrated circuit die, forming a first build-up layer, having contact links coupled to the integrated circuit die, on the core material layer, and coupling component interconnect pads to the contact links; and forming system interconnects on the first redistribution layer for coupling the through-silicon-via die, the integrated circuit die, the component interconnect pads, or a combination thereof.

The present invention provides an integrated circuit package system, including: a through-silicon-via die having conductive vias therethrough; a first redistribution layer on a bottom of the through-silicon-via die coupled to the conductive vias; a second redistribution layer on the top of the through-silicon-via die coupled to the conductive vias; an embedded die superstructure formed on the second redistribution layer includes: an integrated circuit die adhered to the second redistribution layer, a core material layer formed on the second redistribution layer to be coplanar with the integrated circuit die, a first build-up layer, having contact links coupled to the integrated circuit die, on the core material layer, and component interconnect pads coupled to the contact links; and system interconnects on the first redistribution layer coupled to the through-silicon-via die, the integrated circuit die, the component interconnect pads, or a combination thereof.

Certain embodiments of the invention have other steps or elements in addition to or in place of those mentioned above. The steps or element will become apparent to those skilled in

BEST MODE FOR CARRYING OUT THE INVENTION

Figure 1:
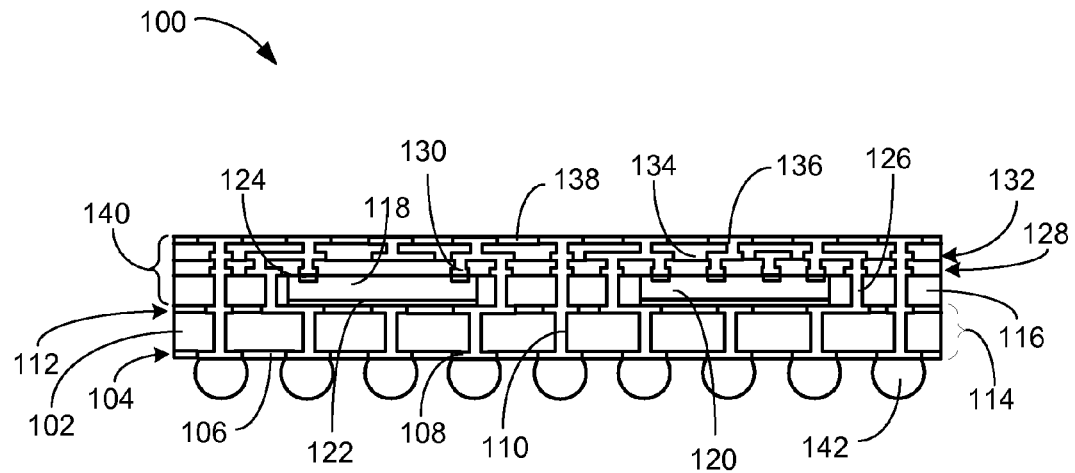
FIG. 1 is a cross-sectional view of an integrated circuit package system with embedded die superstructure in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described, having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the through-silicon-via die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements.

The term "processing" as used herein includes deposition of material or photoresist, patterning, exposure, development, etching, cleaning, and/or removal of the material or photoresist as required in forming a described structure.

Referring now to FIG. 1, therein is shown a cross-sectional view of an integrated circuit package system 100 with embedded die superstructure in a first embodiment of the present invention. The cross-sectional view of the integrated circuit package system 100 depicts a through-silicon-via die 102, having via openings through the semiconductor substrate, with a first redistribution layer 104 on the bottom side.

The first redistribution layer 104 may include a first insulator 106, such as a polyimide layer, patterned to be between and coplanar with a first interconnect layer 108. The first interconnect layer 108, such as a metal layer, may include contacts and traces for implementing the first redistribution layer 104.

Conductive vias 110 may penetrate the through-silicon-via die 102, to completely fill the openings through the semiconductor substrate, for coupling the contacts of the first redistribution layer 104 to a second redistribution layer 112 formed on the top of the through-silicon-via die 102. The conductive vias 110 may include an insulation layer (not shown) formed around a metal fill layer, such as Copper (Cu), Nickel (Ni), Zink (Zn), Tin (Sn), or a combination thereof, of the conductive vias 110.

The second redistribution layer 112 may be formed in a manor substantially similar as the first redistribution layer 104. The second redistribution layer 112 may include the first insulator 106, such as a polyimide layer, patterned to be between and coplanar with the first interconnect layer 108. The first interconnect layer 108, such as a metal layer, may include contacts and traces for implementing the first redistribution layer 104.

A through-silicon-via base 114 may include the first redistribution layer 104, the through-silicon-via die 102, and the second redistribution layer 112. The through-silicon-via die 102 may have an active surface including integrated circuitry (not shown) on the bottom or the top of the through-silicon-via die 102.

A core material layer 116, such as a fiber reinforced epoxy resin may be applied on the second redistribution layer 112 to enclose a first integrated circuit die 118 and a second integrated circuit die 120. The first integrated circuit die 118 and the second integrated circuit die 120 may be attached to the second redistribution layer 112 by an adhesive 122, such as a die attach material.

The core material layer 116 may have a thickness that is equal to the thickness of the first integrated circuit die 118 and the adhesive 122 that attaches it to the second redistribution layer 112. The second integrated circuit die 120 may be set to the equal thickness by adjusting the amount of the adhesive 122 used to attach it to the second redistribution layer 112.

The first integrated circuit die 118 and the second integrated circuit die 120 may have connection pads 124 distributed on their active surfaces, which may be facing upward to be coplanar with the core material layer 116. Core vias 126 may extend through the core material layer 116 to be of equal height with the connection pads 124.

A first build-up layer 128, such as an Ajinomoto Build-up Film (ABF) or Poly Propylene Glycol (PPG) layer, may be formed on the core material layer 116. Contact links 130 may be formed on the connection pads 124 and the core vias 126 in order to couple a substrate redistribution layer 132.

The substrate redistribution layer 132 may include a second build-up layer 134, such as an Ajinomoto Build-up Film (ABF) or Poly Propylene Glycol (PPG) layer that may be formed on the first build-up layer 128. The substrate redistribution layer 132 may include coupling circuitry such as contacts and traces that connect the contact links 130 to component interconnect pads 136.

The component interconnect pads 136 may be separated by a component insulator 138, such as solder mask. The component interconnect pads 136 and the component insulator 138 may form a top surface of an embedded die superstructure 140 that is constructed on the through-silicon-via base 114.

Both the embedded die superstructure 140 and the through-silicon-via base 114 show evidence of being concurrently singulated from a wafer (not shown) to form the integrated circuit package system 100. System interconnects 142 are formed on the contact regions of the first interconnect layer 108 exposed at the bottom of the through-silicon-via base 114.

It has been discovered that the integrated circuit package system 100 of the present invention may provide a highly manufacturable and reliable multi-chip package that supports stacking of additional electronic components, such as additional packages, integrated circuit die, discrete components, or a combination thereof. It has also been discovered that reduction of mechanical operations provides a repeatable and reliable manufacturing flow.

It is understood that the inclusion of the first integrated circuit die 118 and the second integrated circuit die 120 is an example only and any number of the embedded integrated circuit die may be possible. It is also a further example that the invention has the first build-up layer 128 and the second build-up layer 134 as additional build-up layers may be used in order to form electrical connections between the first integrated circuit die 118, the second integrated circuit die 120, the through-silicon-via die 102, the component interconnect pads 136, the system interconnects 142, or a combination thereof.

The number and position of the system interconnects 142, the conductive vias 110, and the component interconnect pads 136 is also an example only and other combinations are possible. In the manufacturing of the integrated circuit package system 100, the first integrated circuit die 118 and the second integrated circuit die 120 may be mounted on the second redistribution layer 112 prior to depositing the core material layer 116 or the core material layer 116 may be deposited first and a die receiving area may be etched as a secondary operation. Both of these processes provide the integrated circuit package system 100 of the present invention.

Figure 2:
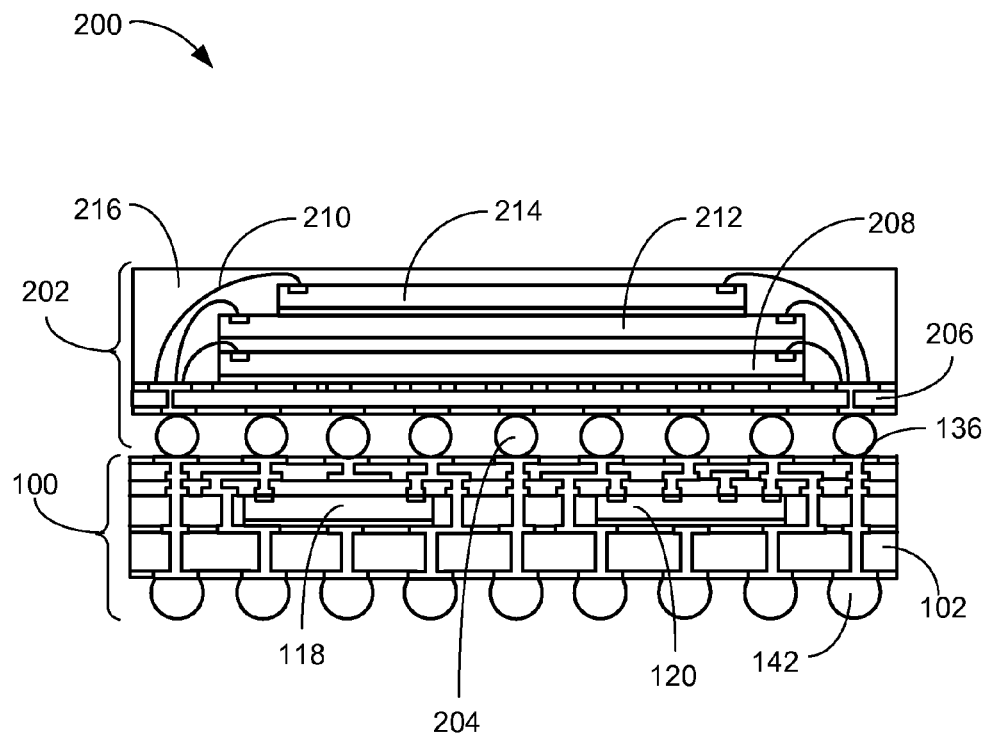
FIG. 2 is a cross-sectional view of a first package-on-package stack using the first embodiment of the present invention.

Referring now to FIG. 2, therein is shown a cross-sectional view of a first package-on-package stack 200 using the first embodiment of the present invention. The cross-sectional view of the first package-on-package stack 200 depicts the integrated circuit package system 100 having an integrated circuit package 202 stacked and coupled to the component interconnect pads 136 by chip interconnects 204.

The integrated circuit package 202 includes a package substrate 206 with a first stacked integrated circuit die 208 mounted on the package substrate 206. Electrical interconnects 210, such as bond wires may couple the first stacked integrated circuit die 208 to the package substrate 206.

A second stacked integrated circuit die 212 may be mounted above the first stacked integrated circuit die 208. The second stacked integrated circuit die 212 is coupled to the package substrate 206 by the electrical interconnects 210.

A third stacked integrated circuit die 214 may be mounted over the second stacked integrated circuit die 212. The third stacked integrated circuit die 214 is coupled to the package substrate 206 by the electrical interconnects 210. A package body 216, such as an epoxy molding compound may be formed on the package substrate 206, the first stacked integrated circuit die 208, the electrical interconnects 210, the second stacked integrated circuit die 212, and the third stacked integrated circuit die 214.

The stacking of the integrated circuit package 202 may provide and electrical connection between the first integrated circuit die 118, the second integrated circuit die 120, the through-silicon-via die 102, the system interconnects 142, the first stacked integrated circuit die 208, the second stacked integrated circuit die 212, the third stacked integrated circuit die 214, or a combination thereof. The integrated circuit package 202 having the first stacked integrated circuit die 208, the second stacked integrated circuit die 212, and the third stacked integrated circuit die 214 is an example only and any number of the integrated circuit dies may be included in the integrated circuit package 202.

Figure 3:
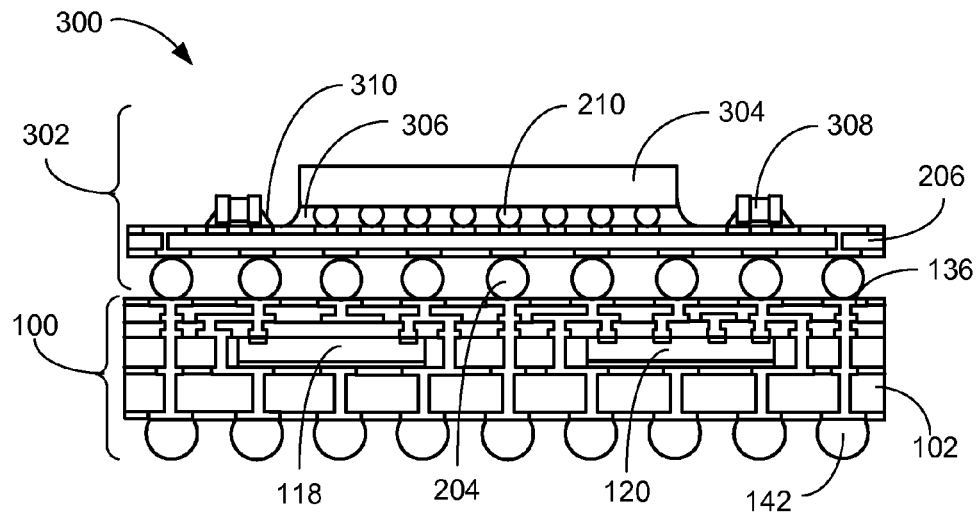
FIG. 3 is a cross-sectional view of a second package-on-package stack using the first embodiment of the present invention.

Referring now to FIG. 3, therein is shown a cross-sectional view of a second package-on-package stack 300 using the first embodiment of the present invention. The cross-sectional view of the second package-on-package stack 300 depicts the integrated circuit package system 100 having an integrated circuit carrier 302 stacked and coupled to the component interconnect pads 136 by the chip interconnects 204.

The integrated circuit carrier 302 includes the package substrate 206 with a first stacked flip chip die 304 mounted on the package substrate 206. The electrical interconnects 210, such as solder bumps may couple the first stacked flip chip die 304 to the package substrate 206.

The first stacked flip chip die 304 may have an adhesive sealant 306, such as an underfill material, applied between the package substrate 206 and the active side of the first stacked flip chip die 304. Discrete components 308 may be coupled to the top side of the package substrate 206 by a conductive adhesive 310 for forming an electrical connection between the first integrated circuit die 118, the second integrated circuit die 120, the through-silicon-via die 102, the system interconnects 142, the first stacked flip chip die 304, the discrete components 308, or a combination thereof.

It has been discovered that the inclusion of the discrete components 308 on the integrated circuit carrier 302 may provide precision analog circuitry that would not be economically feasible to fabricate in an integrated circuit. The combination of the multi-chip integration of the integrated circuit package system 100 and the integrated circuit carrier 302 may provide an extremely flexible fabrication platform for combining high levels of integration and precision analog capabilities.

Figure 4:
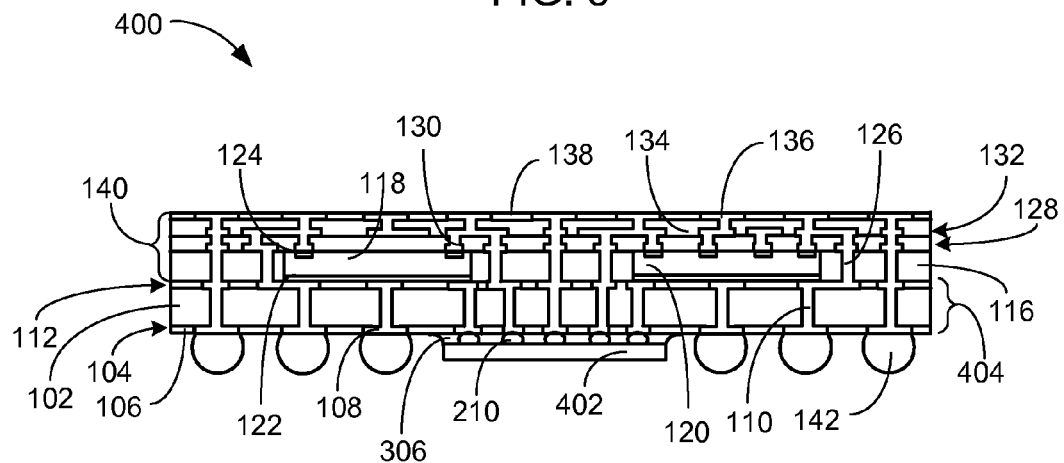
FIG. 4 is a cross-sectional view of an integrated circuit package system with embedded die superstructure in a second embodiment of the present invention.

Referring now to FIG. 4, therein is shown a cross-sectional view of an integrated circuit package system 400 with embedded die superstructure in a second embodiment of the present invention. The cross-sectional view of the integrated circuit package system 400 depicts the through-silicon-via die 102 having the first redistribution layer 104 on the bottom side.

The first redistribution layer 104 may include the first insulator 106, such as a polyimide layer, patterned to be between and coplanar with the first interconnect layer 108. The first interconnect layer 108, such as a metal layer, may include contacts and traces for implementing the first redistribution layer 104.

The conductive vias 110 may penetrate the through-silicon-via die 102 for coupling the contacts of the first redistribution layer 104 to the second redistribution layer 112 formed on the top of the through-silicon-via die 102. The conductive vias 110 may include the insulation layer (not shown) formed around a metal fill layer, such as Copper (Cu), Nickel (Ni), Zink (Zn), Tin (Sn), or a combination thereof, of the conductive vias 110.

The second redistribution layer 112 may be formed in a manor substantially similar as the first redistribution layer 104. The second redistribution layer 112 may include the first insulator 106, such as a polyimide layer, patterned to be between and coplanar with the first interconnect layer 108. The first interconnect layer 108, such as a metal layer, may include contacts and traces for implementing the first redistribution layer 104.

A first external die 402 may be coupled to the bottom contacts of the first interconnect layer 108 by the electrical interconnects 210, such as solder bumps. The first external die 402 may have the adhesive sealant 306 optionally applied to the first redistribution layer 104 for protecting the electrical interconnects 210.

A through-silicon-via base 404 may include the first redistribution layer 104, the through-silicon-via die 102, the second redistribution layer 112, and the first external die 402. The through-silicon-via die 102 may have the active surface including integrated circuitry (not shown) on the bottom or the top of the through-silicon-via die 102.

The core material layer 116, such as a fiber reinforced epoxy resin may be applied on the second redistribution layer 112 to enclose the first integrated circuit die 118 and the second integrated circuit die 120. The first integrated circuit die 118 and the second integrated circuit die 120 may be attached to the second redistribution layer 112 by the adhesive 122, such as a die attach material.

The core material layer 116 may have the thickness that is equal to the thickness of the first integrated circuit die 118 and the adhesive 122 that attaches it to the second redistribution layer 112. The second integrated circuit die 120 may be set to the equal thickness by adjusting the amount of the adhesive 122 used to attach it to the second redistribution layer 112.

The first integrated circuit die 118 and the second integrated circuit die 120 may have the connection pads 124 distributed on their active surfaces, which may be facing upward to be coplanar with the core material layer 116. The core vias 126 may extend through the core material layer 116 to be of equal height with the connection pads 124.

The first build-up layer 128, such as an Ajinomoto Build-up Film (ABF) or Poly Propylene Glycol (PPG) layer, may be formed on the core material layer 116. The contact links 130 may be formed on the connection pads 124 and the core vias 126 in order to couple the substrate redistribution layer 132.

The substrate redistribution layer 132 may include the second build-up layer 134, such as an Ajinomoto Build-up Film (ABF) or Poly Propylene Glycol (PPG) layer, which may be formed on the first build-up layer 128. The substrate redistribution layer 132 may include coupling circuitry such as contacts and traces that connect the contact links 130 to the component interconnect pads 136.

The component interconnect pads 136 may be separated by the component insulator 138, such as solder mask. The component interconnect pads 136 and the component insulator 138 may form a top surface of the embedded die superstructure 140 that is constructed on the through-silicon-via base 404.

Both the embedded die superstructure 140 and the through-silicon-via base 404 show evidence of being concurrently singulated from a wafer (not shown) to form the integrated circuit package system 400. The system interconnects 142 are formed on the contact regions of the first interconnect layer 108 exposed at the bottom of the through-silicon-via base 404.

It is understood that the inclusion of the first integrated circuit die 118 and the second integrated circuit die 120 is an example only and any number of the embedded integrated circuit die may be possible. It is also a further example that the invention has the first build-up layer 128 and the second build-up layer 134 as additional build-up layers may be used in order to form electrical connections between the first integrated circuit die 118, the second integrated circuit die 120, the through-silicon-via die 102, the first external die 402, the component interconnect pads 136, the system interconnects 142, or a combination thereof.

Figure 5:
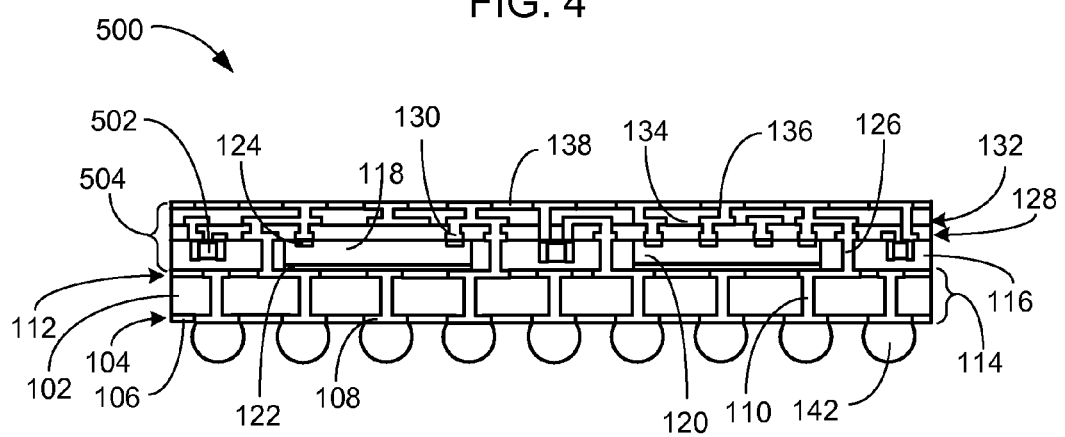
FIG. 5 is a cross-sectional view of an integrated circuit package system with embedded die superstructure in a third embodiment of the present invention.

Referring now to FIG. 5, therein is shown a cross-sectional view of an integrated circuit package system 500 with embedded die superstructure in a third embodiment of the present invention. The cross-sectional view of the integrated circuit package system 500 depicts the through-silicon-via die 102 having the first redistribution layer 104 on the bottom side.

The first redistribution layer 104 may include the first insulator 106, such as a polyimide layer, patterned to be between and coplanar with the first interconnect layer 108. The first interconnect layer 108, such as a metal layer, may include contacts and traces for implementing the first redistribution layer 104.

The conductive vias 110 may penetrate the through-silicon-via die 102 for coupling the contacts of the first redistribution layer 104 to the second redistribution layer 112 formed on the top of the through-silicon-via die 102. The conductive vias 110 may include the insulation layer (not shown) formed around a metal fill layer, such as Copper (Cu), Nickel (Ni), Zink (Zn), Tin (Sn), or a combination thereof, of the conductive vias 110.

The second redistribution layer 112 may be formed in a manor substantially similar as the first redistribution layer 104. The second redistribution layer 112 may include the first insulator 106, such as a polyimide layer, patterned to be between and coplanar with the first interconnect layer 108. The first interconnect layer 108, such as a metal layer, may include contacts and traces for implementing the first redistribution layer 104.

The through-silicon-via base 114 may include the first redistribution layer 104, the through-silicon-via die 102, and the second redistribution layer 112. The through-silicon-via die 102 may have the active surface including integrated circuitry (not shown) on the bottom or the top of the through-silicon-via die 102.

The core material layer 116, such as a fiber reinforced epoxy resin may be applied on the second redistribution layer 112 to enclose the first integrated circuit die 118 and the second integrated circuit die 120. The first integrated circuit die 118 and the second integrated circuit die 120 may be attached to the second redistribution layer 112 by the adhesive 122, such as a die attach material. Embedded discrete components 502 may be mounted in the core material layer 116 by etching a receiving space and inserting the embedded discrete components 502.

The core material layer 116 may have the thickness that is equal to the thickness of the first integrated circuit die 118 and the adhesive 122 that attaches it to the second redistribution layer 112. The second integrated circuit die 120 may be set to the equal thickness by adjusting the amount of the adhesive 122 used to attach it to the second redistribution layer 112.

The first integrated circuit die 118 and the second integrated circuit die 120 may have the connection pads 124 distributed on their active surfaces, which may be facing upward to be coplanar with the core material layer 116. The core vias 126 may extend through the core material layer 116 to be of equal height with the connection pads 124.

The first build-up layer 128, such as an Ajinomoto Build-up Film (ABF) or Poly Propylene Glycol (PPG) layer, may be formed on the core material layer 116. The contact links 130 may be formed on the connection pads 124, the embedded discrete components 502, and the core vias 126 in order to couple the substrate redistribution layer 132.

The substrate redistribution layer 132 may include the second build-up layer 134, such as an Ajinomoto Build-up Film (ABF) or Poly Propylene Glycol (PPG) layer, that may be formed on the first build-up layer 128. The substrate redistribution layer 132 may include coupling circuitry such as contacts and traces that connect the contact links 130 to the component interconnect pads 136.

The component interconnect pads 136 may be separated by the component insulator 138, such as solder mask. The component interconnect pads 136 and the component insulator 138 may form a top surface of an embedded die superstructure 504 that is constructed on the through-silicon-via base 404.

Both the embedded die superstructure 504 and the through-silicon-via base 114 show evidence of being concurrently singulated from a wafer (not shown) to form the integrated circuit package system 400. The system interconnects 142 are formed on the contact regions of the first interconnect layer 108 exposed at the bottom of the through-silicon-via base 114.

It is understood that the inclusion of the first integrated circuit die 118 and the second integrated circuit die 120 is an example only and any number of the embedded integrated circuit die may be possible. It is also a further example that the invention has the first build-up layer 128 and the second build-up layer 134 as additional build-up layers may be used in order to form electrical connections between the first integrated circuit die 118, the second integrated circuit die 120, the through-silicon-via die 102, the embedded discrete components 502, the component interconnect pads 136, the system interconnects 142, or a combination thereof.

It has been discovered that the addition of the embedded discrete components 502 in the core material layer 116 may provide additional design flexibility by allowing precision analog components to be placed in very close proximity to the first integrated circuit die 118, the second integrated circuit die 120 and the through-silicon-via die 102. The close proximity of the embedded discrete components 502 provides enhanced signal quality and reduces electrical noise.

Figure 6:
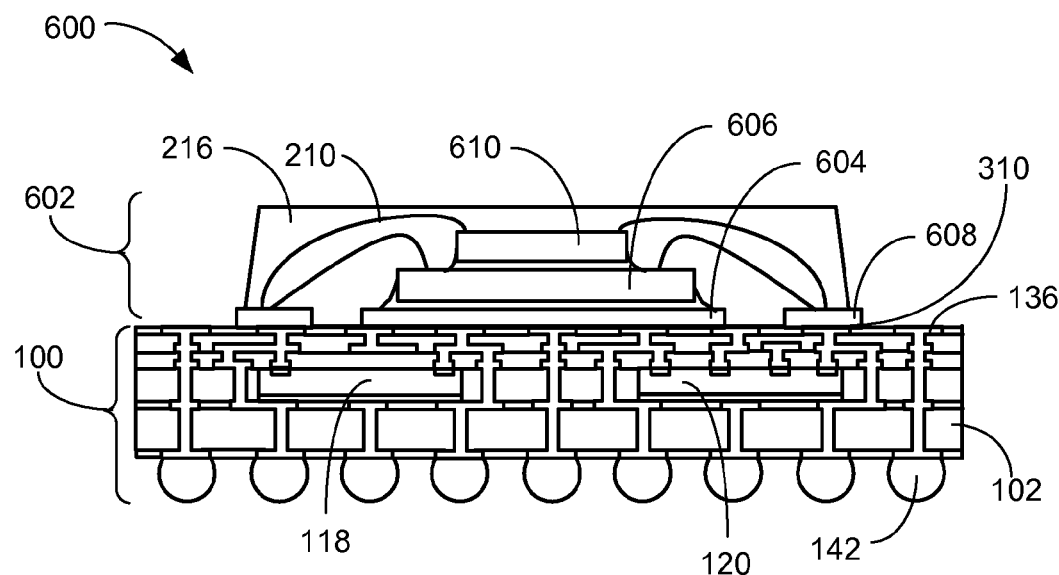
FIG. 6 is a cross-sectional view of a third package-on-package stack using the first embodiment of the present invention.

Referring now to FIG. 6, therein is shown a cross-sectional view of a third package-on-package stack 600 using the first embodiment of the present invention. The cross-sectional view of the third package-on-package stack 600 depicts the integrated circuit package system 100 having a Quad Flatpack No lead (QFN) package 602 stacked and coupled to the component interconnect pads 136 by the conductive adhesive 310.

The QFN package 602 includes a die attach pad 604 with a first stacked QFN die 606 mounted on the die attach pad 604. The electrical interconnects 210, such as bond wires may couple the first stacked QFN die 606 to an external lead 608.

A second stacked QFN die 610 may be mounted above the first stacked QFN die 606. The second stacked QFN die 610 is coupled to the external leads 608 by the electrical interconnects 210. The package body 216, such as an epoxy molding compound may be formed on the die attach pad 604, the first stacked QFN die 606, the second stacked QFN die 610, the electrical interconnects 210, and the external leads 608.

The stacking of the QFN package 602 may provide and electrical connection between the first integrated circuit die 118, the second integrated circuit die 120, the through-silicon-via die 102, the system interconnects 142, the first stacked QFN die 606, the second stacked QFN die 610, or a combination thereof. The QFN package 602 having the first stacked QFN die 606 and the second stacked QFN die 610 is an example only and any number of the integrated circuit dies may be included in the QFN package 602.

It has been discovered that the QFN package 602 may be mounted on any of the embodiments of the present invention, such as the integrated circuit package system 100, the integrated circuit package system 400, of FIG. 4, or the integrated circuit package system 500, of FIG. 5, in order to provide a custom level of integration of both digital logic and precision analog circuitry. It has further been discovered that the embodiments of the present invention may be stacked upon a fan-in or fan-out base package for an enhanced package-on-package stack (not shown).

Figure 7:
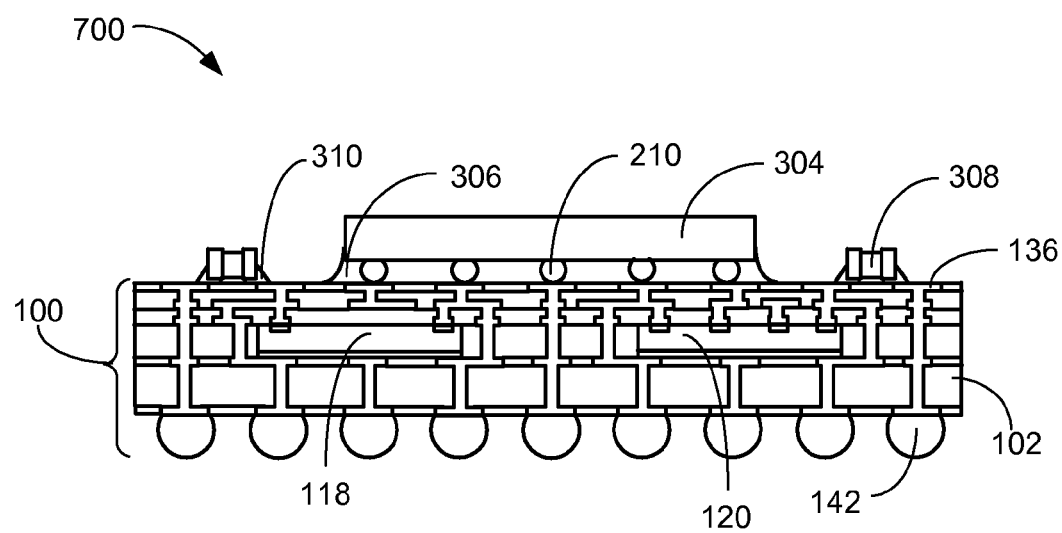
FIG. 7 is a cross-sectional view of a multi-chip package using the first embodiment of the present invention.

Referring now to FIG. 7, therein is shown a cross-sectional view of a multi-chip package 700 using the first embodiment of the present invention. The cross-sectional view of the multi-chip package 700 depicts the integrated circuit package system 100 having the first stacked flip chip die 304 coupled directly to the component interconnect pads 136 by the electrical interconnects 210, such as solder bumps. The adhesive sealant 306 may be applied between the active side of the first stacked flip chip die 304 and top side of the integrated circuit package system 100.

The manufacturing process may be simplified by the direct attachment of the first stacked flip chip die 304. The discrete components 308 may also be directly attached to the component interconnect pads 136 by the conductive adhesive 310. The direct attachment of these components may improve signal quality and enhance the reliability of the multi-chip package 700.

The multi-chip package 700 may provide an electrical connection between the first integrated circuit die 118, the second integrated circuit die 120, the through-silicon-via die 102, the system interconnects 142, the first stacked flip chip die 304, the discrete components 308, or a combination thereof.

It has been discovered that the first stacked flip chip die 304 and the discrete components 308 may be directly mounted on any of the embodiments of the present invention, such as the integrated circuit package system 100, the integrated circuit package system 400, of FIG. 4, or the integrated circuit package system 500, of FIG. 5, in order to provide a custom level of integration of both digital logic and precision analog circuitry. It has further been discovered that the embodiments of the present invention may be stacked upon a fan-in or fan-out base package for an enhanced package-on-package stack (not shown).

Thus, it has been discovered that the integrated circuit package system 100, of FIG. 1, the integrated circuit package system 400, of FIG. 4, and the integrated circuit package system 500, of FIG. 5, of the present invention furnish important and heretofore unknown and unavailable solutions, capabilities, and functional aspects for enhancing the manufacturing processes of multi-chip and package-on-package integrated circuit devices.

Figure 8:
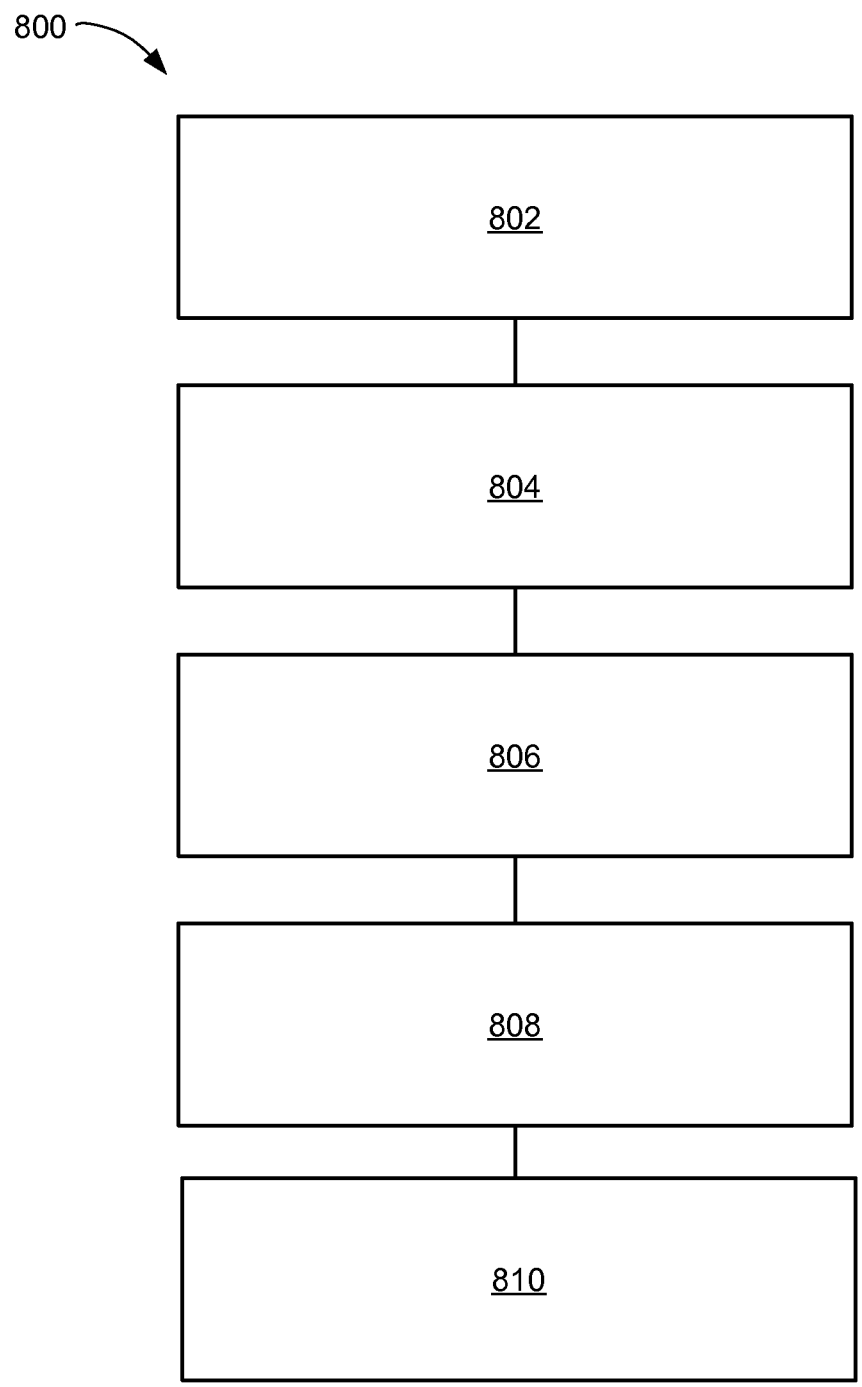
FIG. 8 is a flow chart of a method of manufacture of an integrated circuit package system in a further embodiment of the present invention.

Referring now to FIG. 8, therein is shown a flow chart of a method 800 of manufacture of an integrated circuit package system in a further embodiment of the present invention. The method 800 includes: providing a through-silicon-via die having conductive vias therethrough in a block 802; forming a first redistribution layer on a bottom of the through-siliconvia die coupled to the conductive vias in a block 804; forming a second redistribution layer on the top of the through-silicon-via die coupled to the conductive vias in a block 806; fabricating an embedded die superstructure on the through-silicon-via base by: mounting an integrated circuit die to the second redistribution layer, forming a core material layer on the second redistribution layer to be coplanar with the integrated circuit die, forming a first build-up layer, having contact links coupled to the integrated circuit die, on the core material layer, and coupling component interconnect pads to the contact links in a block 808; and forming system interconnects on the first redistribution layer for coupling the through-silicon-via die, the integrated circuit die, the component interconnect pads, or a combination thereof in a block 810.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing multi-chip packages and package-on-package integrated circuit devices fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit package system comprising:
    providing a through-silicon-via die having conductive vias therethrough;
    forming a first redistribution layer on a bottom of the through-silicon-via die coupled to the conductive vias wherein forming the first redistribution layer includes forming a first insulator between and coplanar with a first interconnect layer;
    forming a second redistribution layer on the top of the through-silicon-via die coupled to the conductive vias;
    fabricating an embedded die superstructure on the second redistribution layer including:
    mounting an integrated circuit die to the second redistribution layer,
    forming a core material layer on the second redistribution layer to be coplanar with the integrated circuit die,
    forming a first build-up layer, having contact links coupled to the integrated circuit die, on the core material layer,
    forming a second build-up layer on the first build-up layer includes forming a substrate redistribution layer having contacts and traces, and
    coupling component interconnect pads to the contact links through the substrate redistribution layer;
    forming system interconnects on the first redistribution layer for coupling the through-silicon-via die, the integrated circuit die, the component interconnect pads, or a combination thereof; and
    mounting embedded discrete components in the core material layer including coupling the contact links between the embedded discrete components and the substrate redistribution layer.

2. The method as claimed in claim 1 further comprising coupling a first external die to the first interconnect layer formed in the first redistribution layer.

3. The method as claimed in claim 1 further comprising coupling an integrated circuit package directly to the component interconnect pads including coupling a quad flatpack no lead package, an integrated circuit carrier, or the integrated circuit package having a first stacked integrated circuit, a second stacked integrated circuit, and a third stacked integrated circuit encapsulated therein.

4. A method of manufacture of an integrated circuit package system comprising:
    providing a through-silicon-via die having conductive vias therethrough;
    forming a first redistribution layer on a bottom of the through-silicon-via die coupled to the conductive vias wherein forming the first redistribution layer includes forming a first insulator between and coplanar with a first interconnect layer;
    forming a second redistribution layer on the top of the through-silicon-via die coupled to the conductive vias;
    fabricating an embedded die superstructure on the second redistribution layer including:
    mounting an integrated circuit die to the second redistribution layer,
    forming a core material layer on the second redistribution layer to be coplanar with the integrated circuit die,
    forming a first build-up layer, having contact links coupled to the integrated circuit die, on the core material layer,
    forming a second build-up layer on the first build-up layer includes forming a substrate redistribution layer having contacts and traces, and
    coupling component interconnect pads to the contact links through the substrate redistribution layer;
    forming system interconnects on the first redistribution layer for coupling the through-silicon-via die, the integrated circuit die, the component interconnect pads, or a combination thereof; and
    coupling discrete components directly to the component interconnect pads includes placing the discrete components directly on the component interconnect pads and coupling with a conductive adhesive.

5. The method as claimed in claim 4 further comprising coupling a first external die to the first interconnect layer formed in the first redistribution layer.

6. The method as claimed in claim 4 further comprising coupling an integrated circuit package directly to the component interconnect pads including coupling a quad flatpack no lead package, an integrated circuit carrier, or the integrated circuit package having a first stacked integrated circuit, a second stacked integrated circuit, and a third stacked integrated circuit encapsulated therein.

7. An integrated circuit package system comprising:
    a through-silicon-via die having conductive vias therethrough;
    a first redistribution layer on a bottom of the through-silicon-via die coupled to the conductive vias;
    a second redistribution layer on the top of the through-silicon-via die coupled to the conductive vias;
    an embedded die superstructure formed on the second redistribution layer includes:
    an integrated circuit die adhered to the second redistribution layer, a core material layer formed on the second redistribution layer to be coplanar with the integrated circuit die, a first build-up layer, having contact links coupled to the integrated circuit die, on the core material layer, and component interconnect pads coupled to the contact links;

system interconnects on the first redistribution layer coupled to the through-silicon-via die, the integrated circuit die, the component interconnect pads, or a combination thereof; and discrete components directly on the component interconnect pads includes a conductive adhesive on the discrete components and the component interconnect pads.

8. The system as claimed in claim 7 further comprising a substrate redistribution layer between the contact links and the component interconnect pads.

9. The system as claimed in claim 7 further comprising core vias, through the core material layer, coupled between the second redistribution layer and the contact links.

10. The system as claimed in claim 7 further comprising an integrated circuit package directly coupled to the component interconnect pads by chip interconnects or conductive adhesive.

11. An integrated circuit package system comprising:

a through-silicon-via die having conductive vias therethrough;

a first redistribution layer on a bottom of the through-silicon-via die coupled to the conductive vias;

a second redistribution layer on the top of the through-silicon-via die coupled to the conductive vias;

an embedded die superstructure formed on the second redistribution layer includes:

an integrated circuit die adhered to the second redistribution layer, a core material layer formed on the second redistribution layer to be coplanar with the integrated circuit die, a first build-up layer, having contact links coupled to the integrated circuit die, on the core material layer, and component interconnect pads coupled to the contact links, system interconnects on the first redistribution layer coupled to the through-silicon-via die, the integrated circuit die, the component interconnect pads, or a combination thereof;

a first insulator between and coplanar with a first interconnect layer in the first redistribution layer;

a second build-up layer, on the first build-up layer, for forming a substrate redistribution layer in the embedded die superstructure; and discrete components directly coupled to the component interconnect pads includes the discrete components directly on the component interconnect pads and coupled by a conductive adhesive.

12. The system as claimed in claim 11 further comprising a first external die coupled to the first interconnect layer formed in the first redistribution layer.

13. The system as claimed in claim 11 further comprising embedded discrete components in the core material layer includes the contact links coupled between the embedded discrete components and the substrate redistribution layer.

14. The system as claimed in claim 11 further comprising an integrated circuit package directly coupled to the component interconnect pads includes a quad flatpack no lead package, an integrated circuit carrier, or the integrated circuit package having a first stacked integrated circuit, a second stacked integrated circuit, and a third stacked integrated circuit encapsulated therein.

* * * * *